United States Patent

[11] 3,602,420

[72] Inventor Richard A. Wilkinson, Jr.
San Jose, Calif.
[21] Appl. No. 10,973
[22] Filed Feb. 12, 1970
[45] Patented Aug. 31, 1971
[73] Assignee International Business Machines Corporation
Armonk, N.Y.

[54] ULTRASONIC BONDING DEVICE
6 Claims, 2 Drawing Figs.

[52] U.S. Cl. .......... 228/1, 29/470.1, 156/73, 310/26
[51] Int. Cl. .......... B23k 1/06, B23k 5/20
[50] Field of Search .......... 310/26; 228/1; 156/73, 580; 29/470.1, 525; 78/82; 32/DIG. 4

[56] References Cited

UNITED STATES PATENTS

| | | | |
|---|---|---|---|
| 2,471,542 | 5/1949 | Rich | 310/26 X |
| 2,955,217 | 10/1960 | Harris | 310/26 |
| 3,007,063 | 10/1961 | Harris | 310/26 |
| 3,029,766 | 4/1962 | Jones | 113/126 |

*Primary Examiner*—John F. Campbell
*Assistant Examiner*—Robert J. Craig
*Attorneys*—Hanifin and Jancin and W. J. Madden, Jr.

ABSTRACT: An ultrasonic bonding system is arranged so that the ultrasonic transducer is situated above and parallel to a bonding tip. A bellcrank functions to change the vibratory motion of the transducer, with respect to the surface of a circuit board, from the perpendicular to the parallel while simultaneously amplifying the vibratory movement. The transducer is held by a mounting member and lateral strap which are affixed at a node on the body of the transducer. The bellcrank member can be adjustable so as to provide for any desired angular relationship between bonding tip and transducer. The bonding tip is fastened to the transducer without intervening driver or horn.

INVENTOR.
RICHARD A. WILKINSON, Jr.
BY Walter J. Madden, Jr.
ATTORNEY

ULTRASONIC BONDING DEVICE

RELATED APPLICATIONS

An ultrasonic bonding structure comprising a magnetostrictive stack of laminations with a bonding tip affixed directly thereto is described and claimed in copending application Ser. No. 10964, filed Feb. 12, 1970, for S. Dushkes and R. Surty, and assigned to the same assignee as the present application.

BACKGROUND OF THE INVENTION

With the increased use of miniature circuits and circuit modules, there has grown a demand for a dependable, compact bonding device for affixing wires and elements to circuit boards. As wires reach increasingly small dimensions (e.g. -0.002 inch in diameter), and are placed in increasingly dense arrangements, conventional bonding methods, such as soldering, become unwieldy and impractical. Soldering can cause shorts between closely adjacent bond sites because the viscosity of molten solder causes it to flow across and bridge the narrow insulative gaps between the sites. Ultrasonic bonding is a reliable alternative to soldering in that it forms dependable bonds without producing any bonding waste products (e.g., excess solder) that could clutter the circuit board.

Ultrasonic bonding is a well-known process; however, there exists a major barrier to the widespread use of ultrasonics in miniature circuit environments in that the inherent bulkiness and geometry of the bonding equipment are not consistent with the small sizes of the rest of the bonding environment. While ultrasonic bonders function particularly well on miniature wires and elements, the bonding equipment itself is of such construction as to severely limit the environs in which ultrasonics can be used.

The typical ultrasonic bonding arrangement consists of a bonding tip, which tip is used to vibrate the wire relative to the board. The tip is mounted at approximately a right angle to a long ultrasonic amplifying device called a horn. The amplifier or horn is abut 1.5 inches long in the usual applications. Attached to the horn at the end opposite to that at which the tip is attached is a relatively large driving stub. The driving stub is of complex geometry in that mounting means must exist at a quarter wave (or nodal) point on the stub and must be attached so that it will not damp the vibrations. Attached to the furthest end of the driving stub is the ultrasonic transducer. The direction of vibratory motion of the transducer is parallel to the line defined by the driving stub and amplifying horn and is perpendicular to the line defined by the bonding tip. The transducer, driving stub, and amplifying horn together are approximately 4 inches long. The transducer, when energized electrically, transmits oscillatory vibratory movements down the driving stub and through the amplifying horn; this movement is finally delivered to the ultrasonic bonding tip.

The prior art bonding system then suffered from a critical disadvantage caused by its geometry. A bonding tip of approximately a half inch in length stood perpendicular, or nearly perpendicular, to the surface of the circuit board while a long bulky combination of amplifying horn, driving stub, mounting means, and ultrasonic transducer was disposed at right angles to the bonding tip and parallel to the circuit board. This meant that the horn-stub-transducer combination was merely a half inch above the surface of the circuit board and extended out parallel to the circuit board's surface for a distance of about four inches. Bearing in mind that main use of ultrasonic bonding is in miniature circuit applications, this four inch member residing close above the surface of the circuit board to which 0. 0.002 inch (for example) diameter wires are being connected becomes incongruous.

The problem facing the ultrasonic bonding artisan then is how to produce ultrasonic bonding equipment which can be used in the increasingly compact world of modern electronic packaging. Conventional equipment can be used with relative convenience when one is dealing with unpopulated circuit boards which are larger than eight inches per side, or even with smaller boards if they are being worked on in open, flat environments. However, when these circuit boards become populated, problems arise. For example, a board may have components protruded vertically from the board's surface for a distance of, say, one or two inches, these components would stymie the further use of a conventional ultrasonic system. The affixed thereto which are relatively tall. If components protruded tip, being perhaps one-half inch in length, cannot reach the surface of the board because the bulky drive train (i.e. horn-stub-transducer combination) which must be disposed parallel to the board's surface, cannot be lowered due to the interfering vertically protruding components.

Another impossible situation arises after a circuit board is populated and is placed in a machine environment. Modern machines are often constructed so that the populated circuit boards reside in deep cavities located in inconvenient places within the machine. If repairs or circuit alterations need be made, it is necessary to remove the board from the machine because the peculiar geometry of conventional ultrasonic bonding equipment makes it impossible to get the equipment within the cavities.

It was thought that these problems could be overcome by merely increasing the length of the bonding tip thereby allowing the drive train to be further removed from the surface of the circuit board. The bonding tip, however, has severe restrictions on its length. The tip, when energized by the amplifying horn, does not merely move back and forth in a stiff manner but rather whips and forms its own sinusoidal vibratory movement mode; that is, the tip itself has a standing wave thereon. As the length of the tip increases, its relative flexibility will increase. The bonding process, which is caused by the end point of the bonding tip vibrating a wire relative to the circuit board, will cease when a slender bonding tip gets beyond a certain length, say 1 inch. After the tip has reached maximum length, the end of the bonding tip merely rests on the surface of the circuit board while its shaft whips in a sinusoidal fashion; that is, the length of the tip coupled with its flexibility destroys the ability of the ultrasonic system to transmit energy to the wire and circuit board surface. The tip can be made longer and still produce bonds if its flexibility is decreased. However, the physics of ultrasonic tips requires that for a fixed resonant frequency, the diameter of the tip varies as the square of the length. Thick bonding tips are unacceptable because of wire buildup conditions. As more and more wires are placed over the surface of a board, there is reached a point where a dense wire maze is created. This maze makes it difficult to make further bonds because the bonding tip, unless it is very slender, cannot penetrate to the board's surface. Because of these aforesaid factors, the length of a bonding tip is, for practical purposes, fixed and therefore the problems attendant to the inherent bulkiness of conventional ultrasonic bonders remain.

It is accordingly an object of this invention to provide a device capable of ultrasonically bonding elements while being suitable for use in physically constricted areas.

It is a more specific object of the present invention to provide a device wherein the direction of vibratory movement of the ultrasonic transducer can be adjusted to any desired angle relative to the vibratory movement of the ultrasonic bonding tip.

It is a further object of this invention to provide an ultrasonic bonding system wherein the transducer can itself be mounted to a support member.

SUMMARY OF THE INVENTION

These and other objects are accomplished by an ultrasonic bonding arrangement wherein a bell crank member is utilized to provide mechanical amplification and to change the direction of vibratory movement and wherein mounting means are affixed directly to the ultrasonic transducer. The "-bellcrank" consists of a slender ultrasonic bonding tip of conventional length which is affixed to a barrel member. A driving shank is affixed to the barrel so that when the shank is vibrated, the barrel, which is mounted on pivots, will transmit the vibrations to the bonding tip. The ultrasonic transducer is connected to the shank and, by attaching the transducer as closely as possible to the point where the shank enters the barrel, mechanical amplification is achieved by means of a lever arm principle. A sinusoidal wave is developed on the bonding tip and by tuning the tip so that an antinode exists at its end point, further amplification is achieved. The amplification attendant to the finely tuned tip and the lever arm action of the bellcrank is more than sufficient to produce strong bonds. The angle between the driving shank and the bonding tip can vary. If it is desired to have the transducer perpendicular to the board's surface, so as to produce the most compact arrangement, the angle will be 90°.

The compact mounting of the relatively heavy transducer is accomplished without the conventional driving stub mount. Conventional bonders are mounted in such a manner as to eliminate any physical touching of the transducer other than at the point where the driving stub is attached. The reason for this is because of the observation that any touching of the transducer kills or severely damps the vibration. It has been discovered, however, that a mount can be affixed directly to the transducer body near the center thereof. This mounting means will not kill or damp the vibratory energy created by the nickel stack. The reason why the mounting member does not damp the vibrations is because there exists a node at the geometric center of the nickel stack transducer. By assuring that the mounting member passes directly through or in the area of the node, the transducer can be safely mounted without the need of a separate driving stub mounting means.

DESCRIPTION OF THE PREFERRED EMBODIMENT

Figure 1:
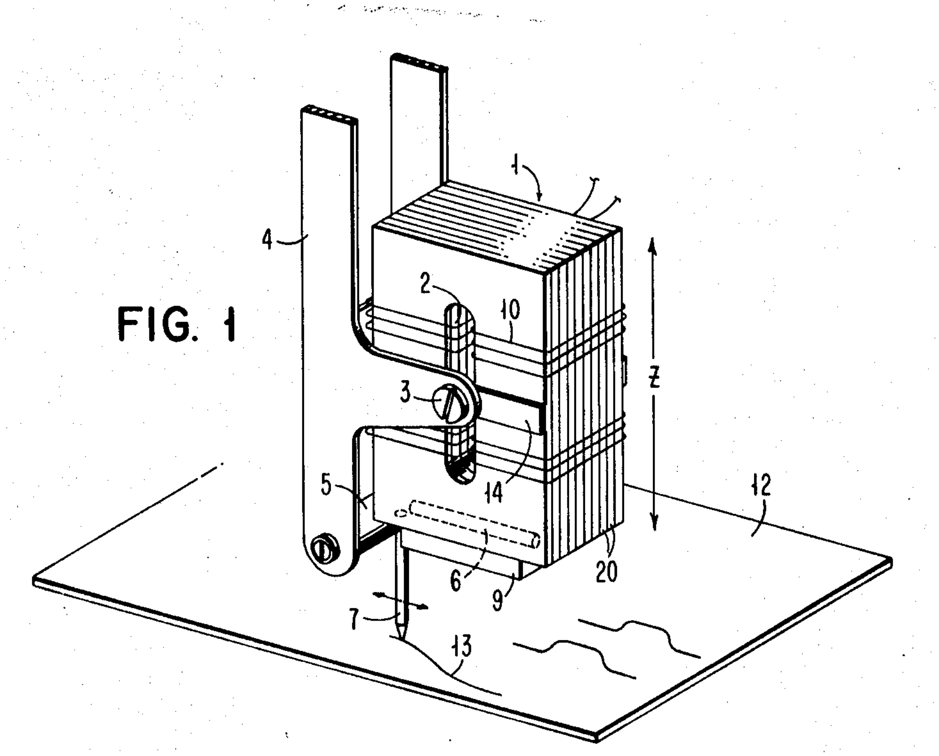
FIG. 1 is an isometric view of an ultrasonic bonder constructed in accordance with the teaching of this invention.
Figure 2:
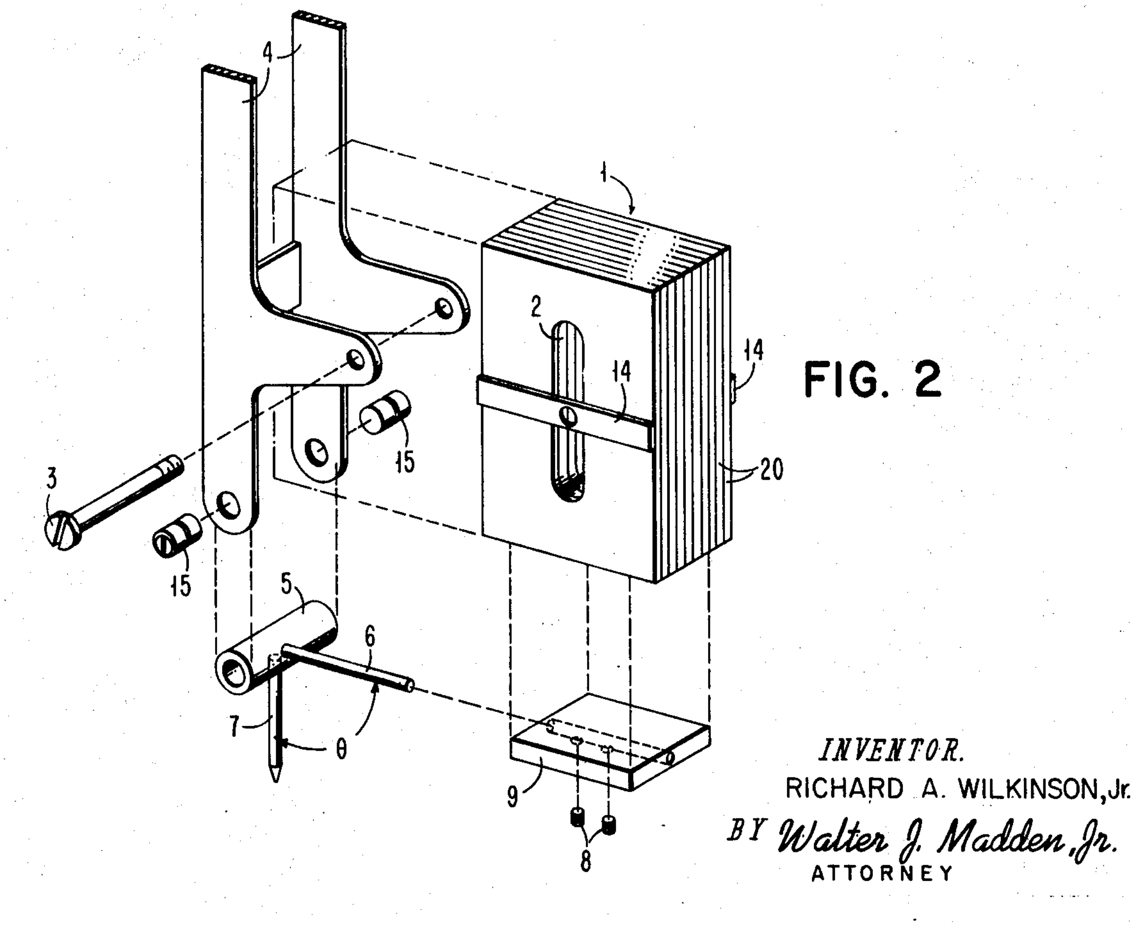
FIG. 2 is an exploded view of FIG. 1 wherein the reference numerals correspond to those of FIG. 1.

Referring particularly to FIGS. 1 and 2, ultrasonic transducer 1 may be of any suitable type such as a piezoelectric device or a magnetostrictive device having nickel-laminated plates 20 which vibrate in the Z-direction when energized by electrical energy applied across a coil 10. The electrical energy supplied to coil 10 is at an ultrasonic frequency (e.g. 60 kilocycles per second). Transducer 1 has slot 2 at its center through which slot mounting means 3 is inserted. Support member 4 carries transducer 1 and bonding arrangement consisting of barrel 5, shank 6 and bonding tip 7. Shank 6 is affixed to transducer 1 by means of set screws 8 and mounting plate 9. Mounting plate 9 is brazed to transducer 1 to provide a strong flexless connection and is connected to shank 6 at a point as close to barrel 5 as is possible. Shank 6 provides mechanical amplification for tip 7. Bonding tip 7 may be constructed of carbides and develops a standing wave along its length when transducer 1 is energized. The amplification of the bonding tip whip action and the mechanical amplification caused by the bellcrank action together provide more than necessary displacement to achieve strong bonds. Circuit board 12 can be of any conventional design as can wire 13. A gold-gold combination of the circuit board and wire has been found to be effective in the forming of strong bonds. Indeed, it has been found that the bonds are stronger than the copper wire itself.

Lateral strap 14, which is held by mounting means 3, extends from slot 2 to the outer edge of transducer 1 as is seen in the figures. Strap 14 provides support to prevent transducer 1 from slipping into a twisting mode of vibration.

Barrel 5 is mounted on member 4 by means of flexure pivots 15. The pivots provide a rotatably flexible connection between the rapidly vibrating barrel 5 and the support member 4. The angle $\theta$ between driving shank 6 and bonding tip 7 does not, of course, have to be 90° but can be varied to suit the environment. The variation of $\theta$ can be achieved by providing bonding tip mounting locations (holes) at various places about the periphery of barrel 5 and placing tip 7 at the location corresponding to the desired $\theta$.

While the invention has been particularly shown and described with reference to a preferred embodiment thereof, it will be understood by those skilled in the art that various changes in the form and details may be made therein without departing from the spirit and scope of the invention.

What is claimed is:

1. An ultrasonic bonding arrangement comprising:
transducer means for producing vibratory movement;
lever means for amplifying said movement and for changing the direction thereof;
said lever means having a rotatably mounted member to which is affixed a bonding tip member and a driving shank member;
means for affixing said driving shank member to said transducer means so that said driving shank is disposed at right angles to the direction of vibratory motion produced by said transducer; and
means for mounting said transducer affixed to a nodal point on the body of said transducer.

2. A system as described in claim 1 wherein said mounting means includes lateral strap means affixed at a nodal point on said transducer.

3. A system according to claim 2 wherein said rotatably mounted member is rotatably mounted to an extension of said mounting means.

4. A system according to claim 3 wherein the angle between said bonding tip and said driving shank is variable.

5. An ultrasonic bonding arrangement comprising:
a magnetostrictive transducer having a mounting member located at a nodal point of said transducer;
said transducer converting electrical energy to mechanical vibratory movement which movement is at approximately a right angle to a bond site;
means for changing the direction of said movement from said right angle to a direction substantially parallel to said bond site;
said direction changing means comprising a driving shank, a barrel member, and a bonding tip where said shank is connected between said transducer and said barrel member and said tip is connected to said barrel member and wherein said shank is at approximately a right angle to said mechanical vibratory movement and said tip is approximately parallel to said movement; and
means for supporting said transducer and said direction changing means;
said supporting means connected to said mounting member and rotatably connected to said barrel member.

6. A system according to claim 5 wherein said mounting member comprises a shaft extending through the center of the body of said transducer and lateral strap means located on the surface of said transducer.